(12) United States Patent
Miyoshi et al.

(10) Patent No.: US 6,814,280 B2
(45) Date of Patent: Nov. 9, 2004

(54) MRI APPARATUS AND MRA IMAGING METHOD

(75) Inventors: Mitsuharu Miyoshi, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/372,063

(22) Filed: Feb. 21, 2003

(65) Prior Publication Data

US 2003/0160611 A1 Aug. 28, 2003

(30) Foreign Application Priority Data

Feb. 25, 2002 (JP) ..................................... 2002-048533

(51) Int. Cl.[7] ................................................ G01V 3/00
(52) U.S. Cl. ...................................... 234/319; 324/318
(58) Field of Search ............................... 324/319, 318, 324/309, 307, 314; 600/410; 128/653

(56) References Cited

U.S. PATENT DOCUMENTS

| 4,983,921 A | 1/1991 | Kramer et al. ............... 324/309 |
|---|---|---|
| 5,031,624 A | 7/1991 | Mistretta et al. ............. 128/653 |
| 5,337,749 A | * 8/1994 | Shimizu ...................... 600/419 |
| 5,631,560 A | 5/1997 | Machida ...................... 324/309 |
| 5,821,752 A | * 10/1998 | LeRoux ....................... 324/314 |
| 5,833,610 A | 11/1998 | Yokawa et al. ............. 600/419 |
| 5,846,197 A | 12/1998 | Edelman ...................... 600/419 |
| 6,054,853 A | 4/2000 | Miyamoto et al. .......... 324/309 |
| 6,346,226 B1 | 2/2002 | Stiller et al. ............. 424/14.36 |
| 6,491,895 B2 | 12/2002 | Driehuys et al. .......... 424/9.36 |

* cited by examiner

*Primary Examiner*—Brij B. Shrivastav
(74) *Attorney, Agent, or Firm*—Carl B. Horton, Esq.; Armstrong Teasdale LLP

(57) ABSTRACT

For the purpose of reducing degradation of image quality due to attenuation of signal intensity, or satisfactorily rendering blood flow even when fast blood flow and slow blood flow are simultaneously present in an imaged region, an imaged region A is divided into a plurality of adjacent slabs; RF pulses are transmitted with a flip angle profile whose flip angle α varies with respect to the thickness direction in each of the slabs and whose average flip angle differs for each of the slabs, to collect NMR signals; and blood flow imaging is conducted based on the NMR signals.

17 Claims, 6 Drawing Sheets

MRI apparatus 100

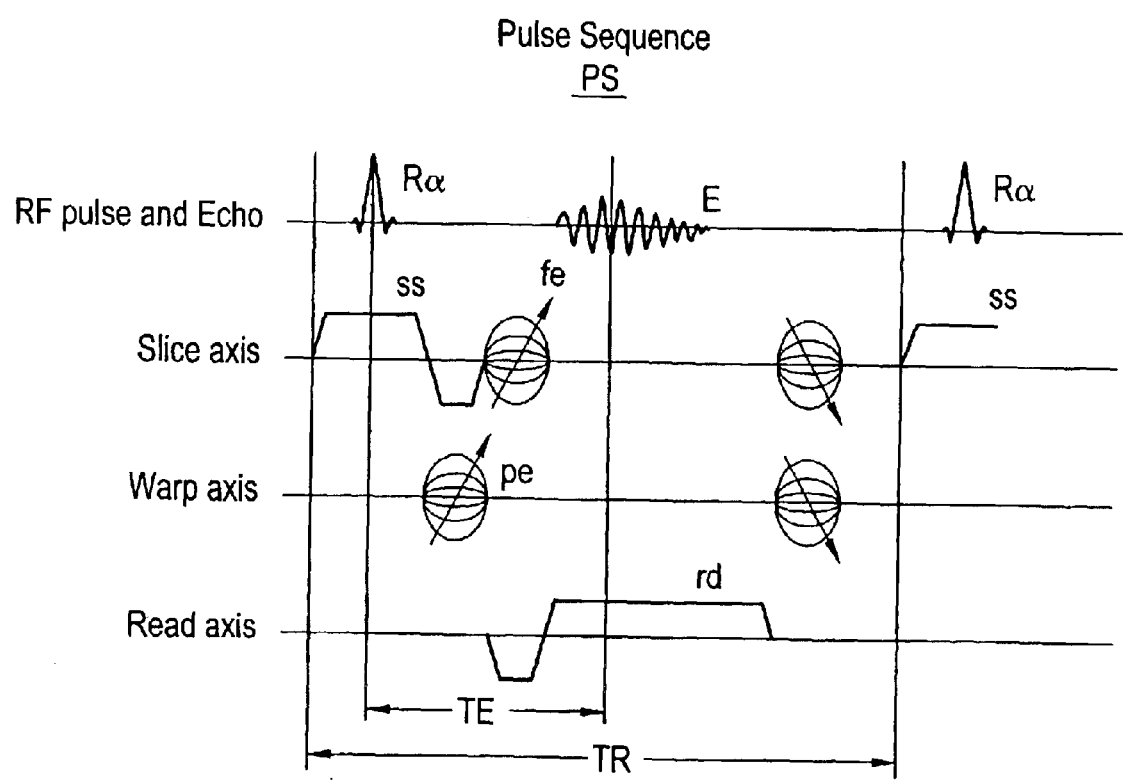

MRI APPARATUS AND MRA IMAGING METHOD

CROSS REFERENCE TO RELATED APPLICATIONS

This application claims the benefit of Japanese Application No. 2002-048533 filed Feb. 25, 2002.

BACKGROUND OF THE INVENTION

The present invention relates to an MRI (magnetic resonance imaging) apparatus and MRA (magnetic resonance angiography) imaging method, and more particularly to an MRI apparatus and MRA imaging method that can reduce degradation of image quality due to attenuation of signal intensity and can satisfactorily render blood flow even when fast blood flow and slow blood flow are simultaneously present in an imaged region.

A TOF (time-of-flight) technique is known as an example of conventional MRA imaging techniques for rendering blood flow.

In general, the TOF technique renders blood flow in white by utilizing an in-flow effect, by which NMR (nuclear magnetic resonance) signals from unsaturated blood flow that flows into a thick slab and that is not saturated by an RF (radio frequency) pulse is intensified as compared with NMR signals corresponding to surrounding tissue that is saturated by an RF pulse.

Examples of the MRA imaging according to the TOF technique will be outlined below.

FIG. 8 is a prior art explanatory diagram showing a relationship among an imaged region A, a slab S', and a flip angle $\alpha$ in imaging blood flow in the head H of a subject.

The thickness L of the imaged region A is 15 cm, for example.

The slab S' has a thickness equal to that of the imaged region A.

As indicated by a flip angle profile P61, the flip angle $\alpha$ has a constant value $\alpha v$ with respect to the thickness direction Z of the slab S'.

If fast blood flow is to be mainly imaged, the flip angle $\alpha v$ is set to a small value (e.g., 20°); and if slow blood flow is to be mainly imaged, the flip angle $\alpha$ is set to a large value (e.g., 40°).

FIG. 9 is a prior art explantory diagram showing a flip angle profile P71 disclosed in Japanese Patent Application Laid Open No. H5-154132.

In the flip angle profile P71, the flip angle $\alpha$ varies with the position in the thickness direction Z. Specifically, the flip angle $\alpha s$ is small near the neck in which blood flow is fast, and the flip angle $\alpha e$ is large near the top of the head in which blood flow is slow, resulting in the linearly varying flip angle $\alpha$.

FIG. 10 is a prior art explanatory diagram showing yet another flip angle profile P81.

In the flip angle profile P81, the imaged region A is divided into a plurality of slabs Sa–Sf each having a thickness $\tau$ smaller than the thickness L of the imaged region A. The thickness $\tau$ is 2.5 cm, for example. The flip angle $\alpha$ has a constant value $\alpha v$ with respect to the thickness direction Z.

In the conventional MRA imaging method described with reference to FIG. 8, the imaging time is reduced because the imaged region is defined as one slab S'; however, since the entire imaged region A has a constant flip angle $\alpha v$, the method poses the problem that it is difficult to satisfactorily render the whole blood flow when fast blood flow and slow blood flow are simultaneously present in the imaged region A.

On the other hand, in the conventional MRA imaging method described with reference to FIG. 9, the imaging time is reduced because the imaged region is defined as one slab S'; however, since the residence time of blood flow in the slab S' is long, the signal intensity in the distal portion attenuates, leading to a problem of degraded image quality.

Further, in the conventional MRA imaging method described with reference to FIG. 10, degradation of image quality due to attenuation of signal intensity is prevented because the imaged region is divided into a plurality of thin slabs Sa–Sf and the time during which blood flow resides in each slab Sa–Sf is reduced: however, since the entire imaged region A has a constant flip angle $\alpha v$, the method poses the problem that it is difficult to satisfactorily render the whole blood flow when fast blood flow and slow blood flow are simultaneously present in the imaged region A.

SUMMARY OF THE INVENTION

It is therefore an object of the present invention is to provide an MRI apparatus and MRA imaging method that can reduce degradation of image quality due to attenuation of signal intensity, and can satisfactorily render blood flow even when fast blood flow and slow blood flow are simultaneously present in an imaged region.

In accordance with its first aspect, the present invention provides an MRI apparatus characterized in comprising: static magnetic field generating means for generating a static magnetic field; gradient magnetic field generating means for generating a gradient magnetic field; RF pulse transmitting means for transmitting RF pulses with a flip angle profile whose flip angle varies with respect to the thickness direction in each of a plurality of adjacent slabs formed by dividing an imaged region and whose average flip angle differs for each slab; NMR signal receiving means for receiving NMR signals from a subject; and blood flow imaging means for conducting blood flow imaging based on said NMR signals.

In the MRI apparatus of the first aspect, the time during which blood flow resides in each slab can be reduced by dividing an imaged region into thin slabs, and thus, attenuation of signal intensity is reduced and image quality is improved. Moreover, since the flip angle is varied in each slab and further the average flip angle is differentiated for each slab, the slabs can be excited by respective flip angles fit to local variation of blood flow conditions; thus, the whole imaged region can be satisfactorily rendered even when fast blood flow and slow blood flow are simultaneously present in the imaged region.

In accordance with its second aspect, the present invention provides the MRI apparatus having the aforementioned configuration, characterized in that the total number of slabs divided by said RF pulse transmitting means is in the range of 3 to 100.

In the MRI apparatus of the second aspect, since the lower limit of the total number of slabs is "3", the blood flow residence time is reduced to ⅓ or less as compared with a case in which the imaged region is defined as one slab. Moreover, since the upper limit of the total number of slabs is "100", the problem of an extremely lengthened total imaging time is avoided.

In accordance with its third aspect, the present invention provides the MRI apparatus having the aforementioned configuration, characterized in that said RF pulse transmitting means transmits ramped RF pulses in which said flip angle linearly varies.

In the MRI apparatus of the third aspect, since the flip angle is linearly varied using ramped RF pulses, RF pulses can be generated and transmitted by relatively simple processing.

In accordance with its fourth aspect, the present invention provides the MRI apparatus having the aforementioned configuration, characterized in that said MRI apparatus comprises flip angle specifying means for specifying flip angles at both ends of said imaged region or at both ends of each said slab, and said RF pulse transmitting means transmits RF pulses whose flip angle linearly varies from the flip angle at one end to the flip angle at the other end.

In the MRI apparatus of the fourth aspect, by an operator etc. simply specifying flip angles at both ends of an imaged region, it is possible to define the property linearly varying from a flip angle at one end to a flip angle at the other end, and therefore, determination of the flip angles involves no cumbersome operation. Moreover, if the flip angles at both ends of each slab are specified, the flip angle property can be minutely defined for each slab.

In accordance with its fifth aspect, the present invention provides the MRI apparatus having the aforementioned configuration, characterized in that said MRI apparatus comprises flip angle specifying means for specifying flip angles at both ends of said imaged region or at both ends of each said slab, and said RF pulse transmitting means transmits RF pulses whose flip angle curvilinearly varies from the flip angle at one end to the flip angle at the other end.

In the MRI apparatus of the fifth aspect, by an operator etc. simply specifying flip angles at both ends of an imaged region, it is possible to define the property smoothly varying from a flip angle at one end to a flip angle at the other end. Moreover, if flip angles at both ends of each slab are specified, the flip angle property can be minutely defined for each slab.

In accordance with its sixth aspect, the present invention provides the MRI apparatus having the aforementioned configuration, characterized in that said MRI apparatus comprises flip angle and ratio factor specifying means for specifying a flip angle at one end of said imaged region and a ratio factor, and said RF pulse transmitting means transmits RF pulses whose flip angle linearly varies from said flip angle at one end to a flip angle at the other end obtained by multiplying said flip angle at one end by said ratio factor.

In the MRI apparatus of the sixth aspect, by an operator etc. simply specifying a flip angle at one end of an imaged region and a ratio factor, it is possible to define the flip angle linearly varying from one end to the other end of the imaged region.

In accordance with its seventh aspect, the present invention provides the MRI apparatus having the aforementioned configuration, characterized in that said MRI apparatus comprises flip angle and ratio factor specifying means for specifying a flip angle at one end of each said slab and a ratio factor, and said RF pulse transmitting means transmits RF pulses whose flip angle linearly varies from said flip angle at one end to a flip angle at the other end obtained by multiplying said flip angle at one end by said ratio factor.

In the MRI apparatus of the seventh aspect, by an operator etc. simply specifying a flip angle at one end of each slab and a ratio factor, it is possible to define the flip angle linearly varying from one end to the other end of the slab.

In accordance with its eighth aspect, the present invention provides the MRI apparatus having the aforementioned configuration, characterized in that said RF pulse transmitting means transmits RF pulses having flip angles that match each other at an abutting portion between adjacent slabs.

In the MRI apparatus of the eight aspect, the flip angle is prevented from having discontinuity between the joint portion between slabs.

In accordance with its ninth aspect, the present invention provides an MRI apparatus characterized in comprising: static magnetic field generating means for generating a static magnetic field; gradient magnetic field generating means for generating a gradient magnetic field; RF pulse transmitting means for transmitting RF pulses with a flip angle profile whose flip angle differs for each of a plurality of adjacent slabs formed by dividing an imaged region; NMR signal receiving means for receiving NMR signals from a subject; and blood flow imaging means for conducting blood flow imaging based on said NMR signals.

In the MRI apparatus of the ninth aspect, the time during which blood flow resides in each slab is reduced by dividing an imaged region into thin slabs, and thus, image quality is improved. Moreover, since the flip angle is differentiated for each slab, the slabs can be excited by respective flip angles fit to local variation of blood flow conditions, and the whole imaged region can be satisfactorily rendered. Furthermore, if the same slab has a constant flip angle, processing can be simplified.

In accordance with its tenth aspect, the present invention provides the MRI apparatus having the aforementioned configuration, characterized in that said RF pulse transmitting means transmits RF pulses having a minimum value of said flip angle of 5°–30° and a maximum value of said flip angle of 35°–90°.

In the MRI apparatus of the tenth aspect, since the minimum value of the flip angle is in the range of 5° to 30°, the problem that too large a flip angle is specified for a blood flow region in which high blood flow rendering performance can be expected is avoided. Moreover, since the maximum value of the flip angle is in the range of 35° to 90°, the problem that too small a flip angle is specified for a blood flow region in which the blood flow rendering performance tends to be poor is avoided.

In accordance with its eleventh aspect, the present invention provides an MRA imaging method characterized in comprising: dividing an imaged region into a plurality of adjacent slabs; transmitting RF pulses with a flip angle profile whose flip angle varying with respect to the thickness direction in each of said slabs and whose average flip angle differs for each slab, to collect NMR signals; and conducting blood flow imaging based on said NMR signals.

In the MRA imaging method of the eleventh aspect, the time during which blood flow resides in each slab can be reduced by dividing an imaged region into thin slabs, and thus, attenuation of signal intensity is reduced and image quality is improved. Moreover, since the flip angle is varied in each slab and further the average flip angle is differentiated for each slab, the slabs can be excited by respective flip angles fit to local variation of blood flow conditions; thus, the whole imaged region can be satisfactorily rendered even when fast blood flow and slow blood flow are simultaneously present in an imaged region.

In accordance with its twelfth aspect, the present invention provides the MRA imaging method having the aforementioned configuration, characterized in that the thickness of said slabs is in the range of 1.5 mm–5 cm.

In the MRA imaging method of the twelfth aspect, since the lower limit of the thickness of slabs is 1.5 mm, the problem of an extremely lengthened imaging time due to a very large total number of slabs is avoided. Moreover, since the upper limit of the thickness of slabs is 5 cm or less, the problem that the time during which blood flow resides within one slab lengthens and signal intensity from the blood flow attenuates is avoided.

In accordance with its thirteenth aspect, the present invention provides the MRA imaging method having the aforementioned configuration, characterized in that said RF pulses are ramped RF pulses in which said flip angle linearly varies.

In the MRA imaging method of the thirteenth aspect, since the flip angle is linearly varied using ramped RF pulses, RF pulses can be generated and transmitted by relatively simple processing.

In accordance with its fourteenth aspect, the present invention provides the MRA imaging method having the aforementioned configuration, characterized in that, when the head of a subject is defined as an imaged region and imaging is conducted by dividing the imaged region into a plurality of slabs adjacent to each other from the carotid artery to the top of the head, the average flip angle in slabs near the carotid artery is smaller than the average flip angle in slabs near the top of the head.

In the MRA imaging method of the fourteenth aspect, an area near the carotid artery in which blood flows fast is excited by a relatively small average flip angle. On the other hand, an area near the top of the head in which blood flows slowly is excited by a relatively large average flip angle. As a result, blood flow throughout the head can be satisfactorily rendered.

In accordance with its fifteenth aspect, the present invention provides an MRA imaging method characterized in comprising: dividing an imaged region into a plurality of adjacent slabs; transmitting RF pulses with a flip angle profile whose flip angle differs for each said slab, to collect NMR signals; and conducting blood flow imaging based on said NMR signals.

In the MRA imaging method of the fifteenth aspect, the time during which blood flow resides in each slab is reduced by dividing an imaged region into thin slabs, and thus, image quality is improved. Moreover, since the flip angle is differentiated for each slab, the slabs can be excited by respective flip angles fit to local variation of blood flow conditions, and the whole imaged region can be satisfactorily rendered. Furthermore, if the same slab has a constant flip angle, processing can be simplified.

In accordance with its sixteenth aspect, the present invention provides the MRA imaging method having the aforementioned configuration, characterized in that blood flow imaging utilizing a TOF effect is conducted.

In the MRA imaging method of the sixteenth aspect, a blood flow image of high quality can be produced by using a TOF effect (in general, an in-flow effect).

According to the MRI apparatus and MRA imaging method of the present invention, the time during which blood flow resides in each slab is reduced, attenuation of signal intensity is reduced, and image quality is improved, by reducing the thickness of the individual slabs. Moreover, rendering performance is improved overall for blood flow having different velocities by differentiating the flip angle for each slab corresponding to variation of blood flow conditions in an imaged region. Especially, local variation of blood flow velocity can be minutely accommodated by the flip angle varying within each slab, thus offering enhanced clinical usefulness.

Further objects and advantages of the present invention will be apparent from the following description of the preferred embodiments of the invention as illustrated in the accompanying drawings.

BRIEF DESCRIPTION OF THE DRAWINGS

FIG. 2 is an exemplary pulse sequence chart of an MRA imaging method using a TOF technique.

DETAILED DESCRIPTION OF THE INVENTION

The present invention will now be described in more detail with reference to embodiments shown in the accompanying drawings. It should be noted that the present invention is not limited to these embodiments.

—First Embodiment—

Figure 1:
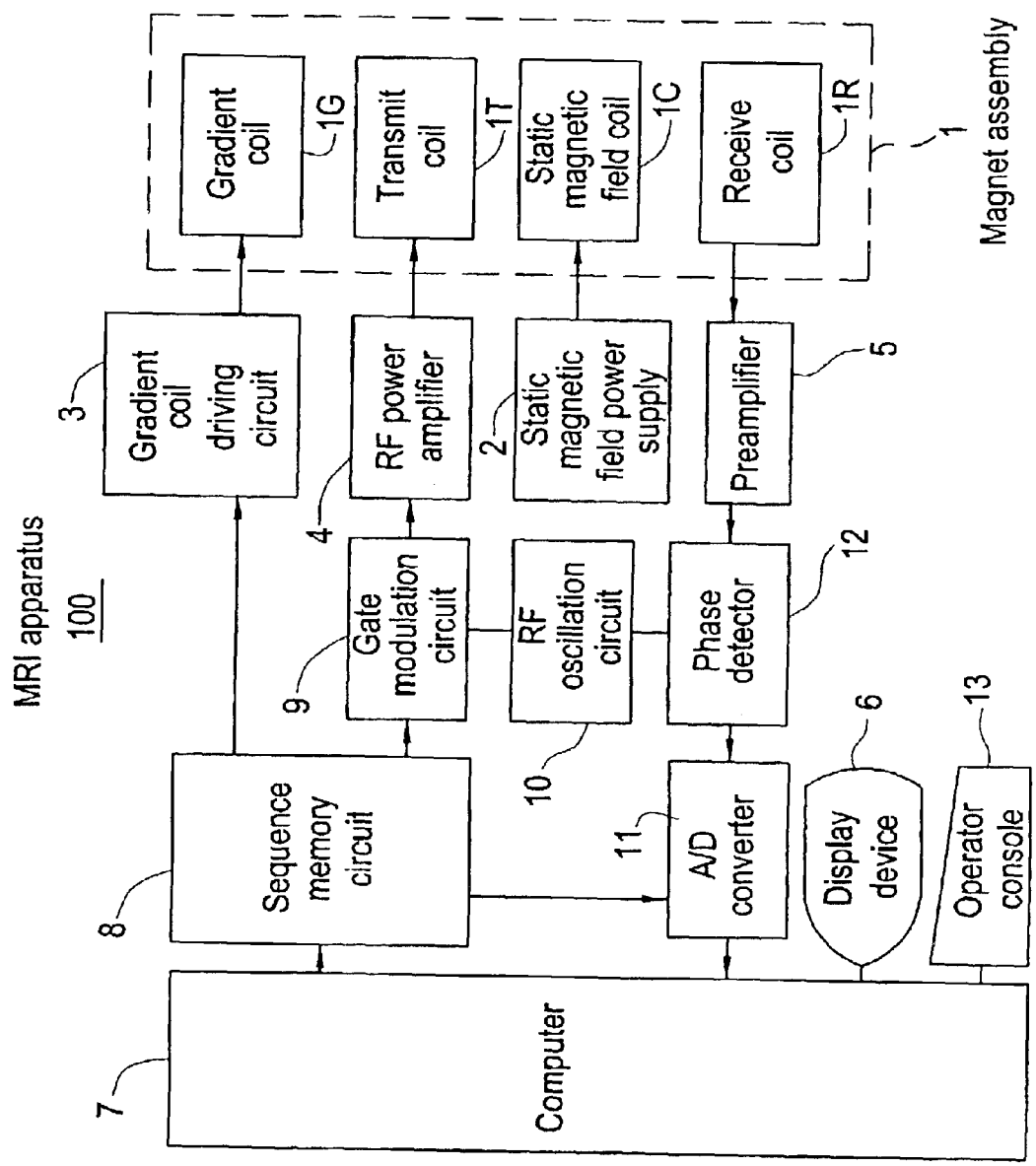
FIG. 1 is a configuration block diagram showing an MRI apparatus in accordance with a first embodiment.

FIG. 1 is a configuration block diagram showing an MRI apparatus in accordance with a first embodiment of the present invention.

In the MRI apparatus 100, a magnet assembly 1 has a bore (cavity portion) for inserting therein a subject, and is provided, surrounding the bore, with a gradient coil (which comprises X-axis, Y-axis and Z-axis coils, and the combination thereof determines slice, warp and read axes) 1G for forming gradient magnetic fields, a transmit coil 1T for applying RF pulses for exciting spins of atomic nuclei within the subject, a receive coil 1R for detecting NMR signals from the subject, and a static magnetic field power supply 2 and static magnetic field coil 1C for generating a static magnetic field.

It should be noted that a permanent magnet pair may be employed in place of the static magnetic field power supply 2 and static magnetic field coil 1C.

The gradient coil 1G is connected to a gradient coil driving circuit 3. The transmit coil 1T is connected to an RF power amplifier 4. The receive coil 1R is connected to a preamplifier 5.

A sequence memory circuit 8 operates the gradient coil driving circuit 3 based on an MRA imaging sequence according to the TOF technique in response to instructions from a computer 7 to thereby generate a gradient magnetic field from the gradient coil 1G. The sequence memory circuit 8 also operates a gate modulation circuit 9 to modulate a high frequency output signal from an RF oscillation circuit 10 into a pulsed signal of predefined timing and envelope. The pulsed signal is applied to the RF power amplifier 4 as an excitation pulse, power-amplified in the RF power amplifier 4, and then applied to the transmit coil 1T in the magnet assembly 1 to transmit an RF pulse.

The preamplifier 5 amplifies NMR signals from the subject detected at the receive coil 1R in the magnet assembly 1, and inputs the signals to a phase detector 12. The phase detector 12 phase-detects the NMR signals from the preamplifier 5 employing the output from the RF oscillation circuit 10 as a reference signal, and supplies the phase-detected signals to an A/D converter 11. The A/D converter 11 converts the phase-detected analog signals into MR data in the form of digital signals, and inputs them to the computer 7.

The computer 7 performs blood flow imaging on the MR data. A blood flow image thereby obtained is displayed on a screen of a display device 6.

The computer 7 is also responsible for overall control such as receiving information supplied from an operator console 13.

FIG. 2 is an exemplary pulse sequence chart of an MRA imaging method using a 3D (three-dimensional) TOF technique.

The pulse sequence PS involves: exciting an object slice by applying an RF pulse Rα and a slice selective gradient ss'; applying a phase encoding gradient pe; applying a slice thickness direction encoding gradient fe; and collecting an NMR signal from an echo E while applying a readout gradient rd. The NMR signal has a strong intensity in a blood flow portion by the TOF effect. The process is repeated with a varying encoding amount of the phase encoding gradient pe and a varying encoding amount of the slice thickness direction encoding gradient fe. Note that TE represents an echo time, and TR represents a repetition time.

Then, a three-dimensional model (volume model) is reconstructed based on the collected NMR signals, and MIP (maximum intensity projection) processing is conducted to produce a blood flow image.

It should be noted that a GRASS (gradient recalled acquisition in the steady state) technique or an SPGR (spoiled GRASS) technique, for example, may be employed as a high speed imaging technique.

FIG. 3 is an explanatory diagram showing a relationship between an imaged region A and the flip angle α for slabs in imaging arterial blood flow in the head H of a subject using the pulse sequence PS of FIG. 2.

Figure 3A:
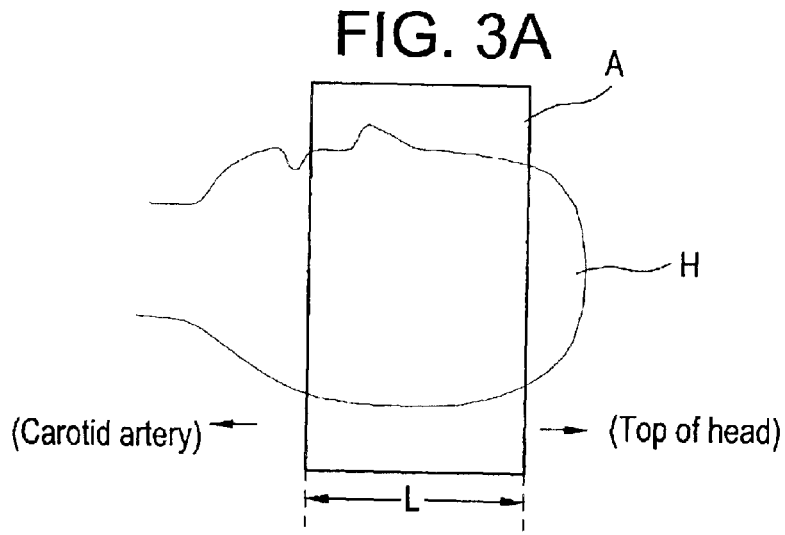
FIG. 3 is an explanatory diagram showing a relationship between an imaged region and flip angles for slabs in the imaging by the pulse sequence of FIG. 2.

In FIG. 3(a), the thickness L of the imaged region A is 15 cm, for example.

Figure 3B:
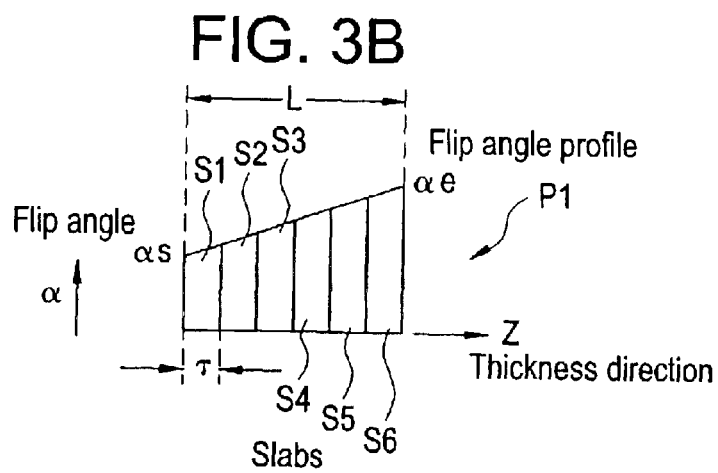

As indicated by a flip angle profile P1 in FIG. 3(b), the imaged region A is imaged separately for slabs S1–S6. The total number of slabs is preferably in the range of 3 to 100. The thickness τ of each slab is preferably in the range of 1.5 mm to 5 cm, for example.

The flip angle α linearly varies with respect to the thickness direction Z from a flip angle αs at an end of the imaged region A near the carotid artery to a flip angle αe at an end near the top of the head. The value of αs is 20°, for example (preferably, 5°–30°). The value of αs is 40°, for example (preferably, 35°–90°). Such a property is implemented by ramped RF pulses, for example.

The property of the flip angle α is established by, for example, the following process (1) or (2):
(1) The operator specifies the flip angles αs and αe at ends of the imaged region A to linearly change the flip angle between αs and αe; or
(2) The operator specifies the flip angle αs at one end of the imaged region A and a ratio factor k to linearly change the flip angle from αs at one end of the imaged region A to αe=k×αs at the other end.

According to the MRI apparatus 100 of the first embodiment, the measure of reducing the blood flow residence time by reducing the thickness τ of the individual slabs S1–S6 makes it possible to enhance the difference between NMR signals from blood flow and those from brain substance, and image quality is improved. Moreover, the flip angle α is small near the carotid artery in which blood flows fast, is large near the top of head in which blood flows slowly, and is medium in the intermediate portion, such as the circle of Willis, in which a turbulent flow portion is present; therefore, the whole blood flow over the imaged region A can be satisfactorily rendered.

Although the following embodiments are basically the same as the first embodiment, the variation pattern of the flip angle is different.

—Second Embodiment—

Figure 4:
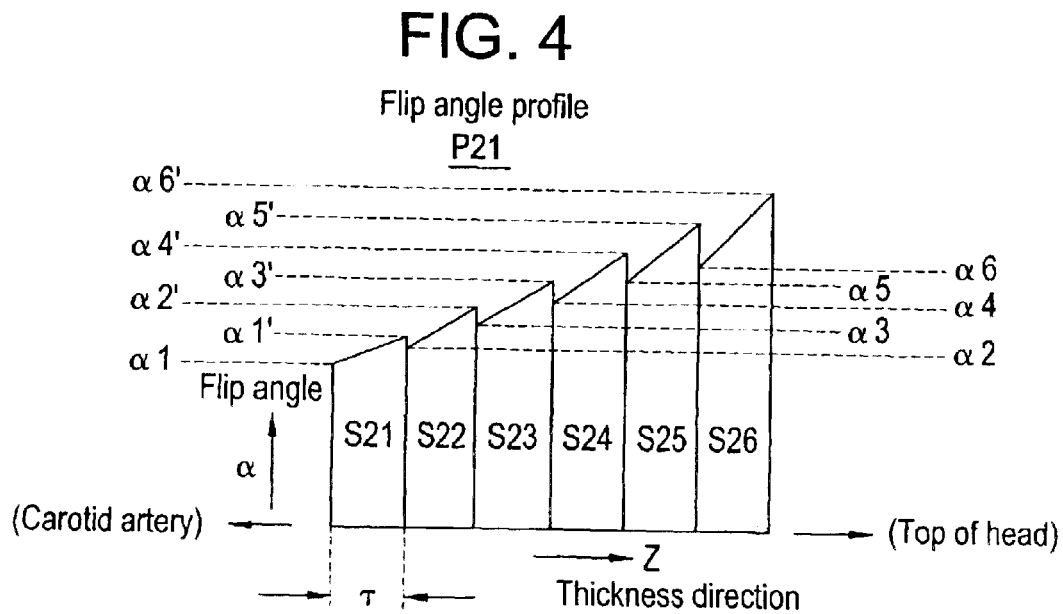
FIG. 4 is an explanatory diagram showing a flip angle profile in accordance with a second embodiment.

FIG. 4 is an explanatory diagram showing a flip angle profile P21 in accordance with a second embodiment.

In the flip angle profile P21, the flip angle α for slabs S21–S26 linearly varies from a flip angle at one end of each slab to a flip angle at the other end obtained by multiplying the flip angle at the one end by a ratio factor K.

In this case, the operator specifies flip angles α1–α6 at one end of each of the slabs S21–S26, and specifies the ratio factor K. Then, the computer 7 and sequence memory circuit 8 calculate flip angles α1'–α6' at the other end of each of the slabs S21–S26 and generate RF pulses needed to linearly change the flip angle from the flip angles α1–α6 at one end to the flip angles α1'–α6' at the other end of the slabs S21–S26.

In the example shown in FIG. 4, the flip angle α at the center point of each of the slabs S21–S26 (=the average flip angle in each of the slabs S21–S26) is defined as linearly varying with respect to the thickness direction Z.

Alternatively, the operator may specify both flip angles at ends of each of the slabs S21–S26.

—Third Embodiment—

Figure 5:
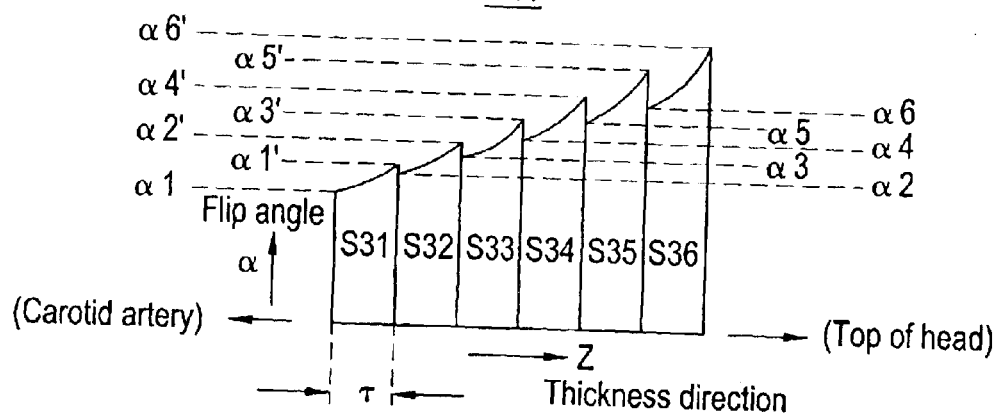
FIG. 5 is an explanatory diagram showing a flip angle profile in accordance with a third embodiment.

FIG. 5 is an explanatory diagram showing a flip angle profile P31 in accordance with a third embodiment.

In the flip angle profile P31, the flip angle α for slabs S31–S36 curvilinearly varies from a flip angle at one end of each slab to a flip angle at the other end obtained by multiplying the flip angle at the one end by a ratio factor K.

In this case, the operator specifies both flip angles at ends of each of the slabs S31–S36, and a function of the curve. Then, the computer 7 and sequence memory circuit 8 generate RF pulses achieving such a property.

—Fourth Embodiment—

Figure 6:
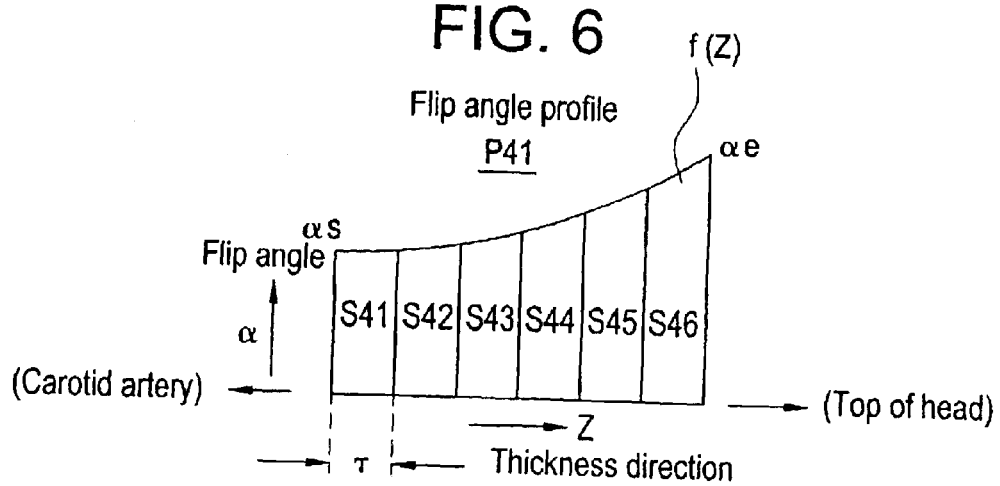
FIG. 6 is an explanatory diagram showing a flip angle profile in accordance with a fourth embodiment.

FIG. 6 is an explanatory diagram showing a flip angle profile P41 in accordance with a fourth embodiment.

In the flip angle profile P41, the flip angle α for slabs S41–S46 curvilinearly varies corresponding to a function f(Z) between flip angles αs and αe at ends of the imaged region (R in FIG. 3).

In this case, the operator specifies the flip angles αs and αe at ends of the imaged region, and the function f(Z). Then, the computer 7 and sequence memory circuit 8 generate RF pulses achieving such a property.

—Fifth Embodiment—

Figure 7:
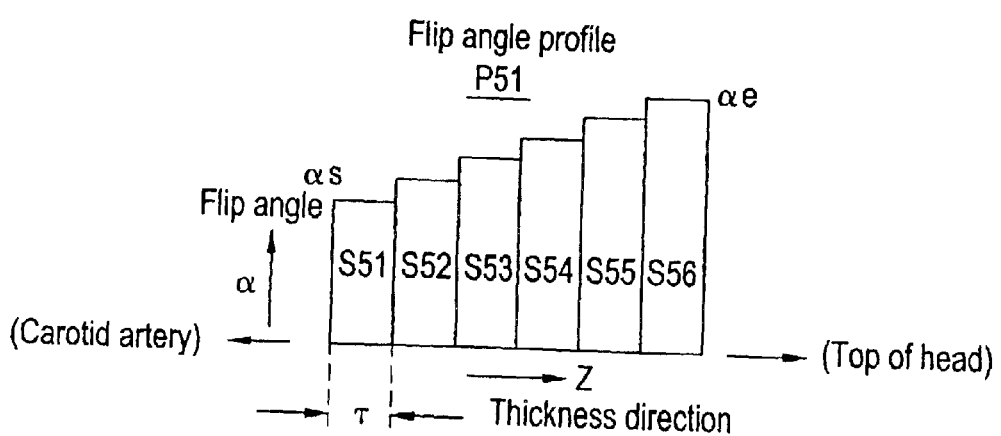
FIG. 7 is an explanatory diagram showing a flip angle profile in accordance with a fifth embodiment.
Figure 8A:
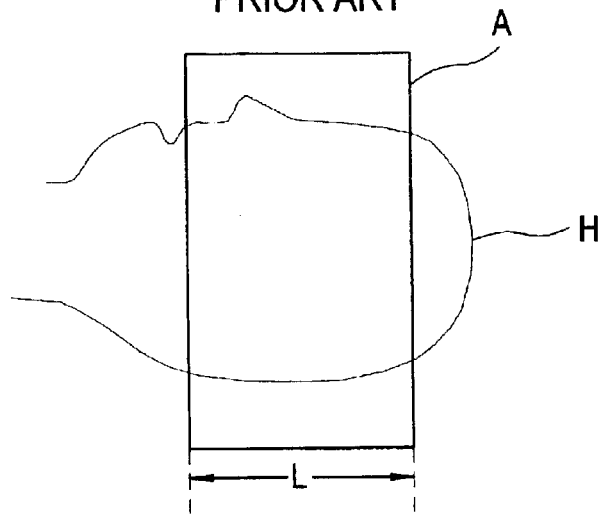
FIG. 8 is a prior art explanatory diagram showing a relationship between an image region and flip angles for slabs in accordance with a conventional technique.
Figure 8B:
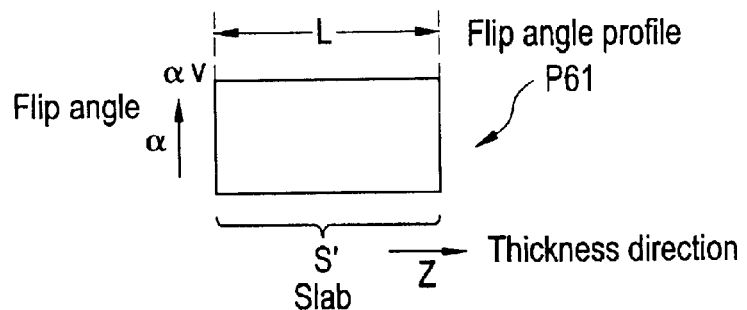
Figure 9:
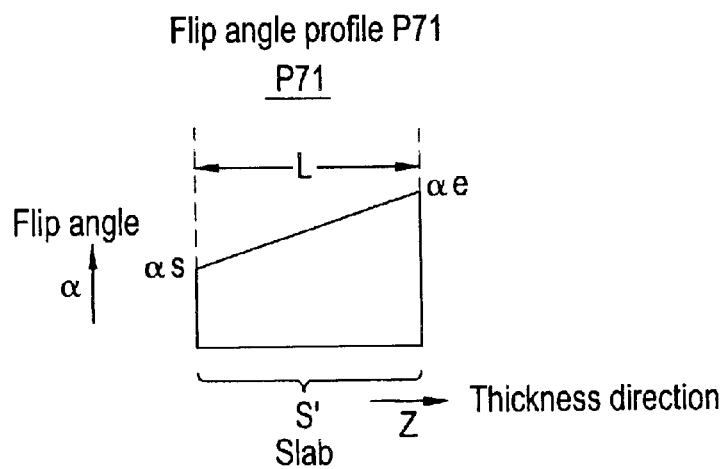
FIG. 9 is a prior art explanatory diagram showing a flip angle profile is accordance with a conventional technique.
Figure 10:
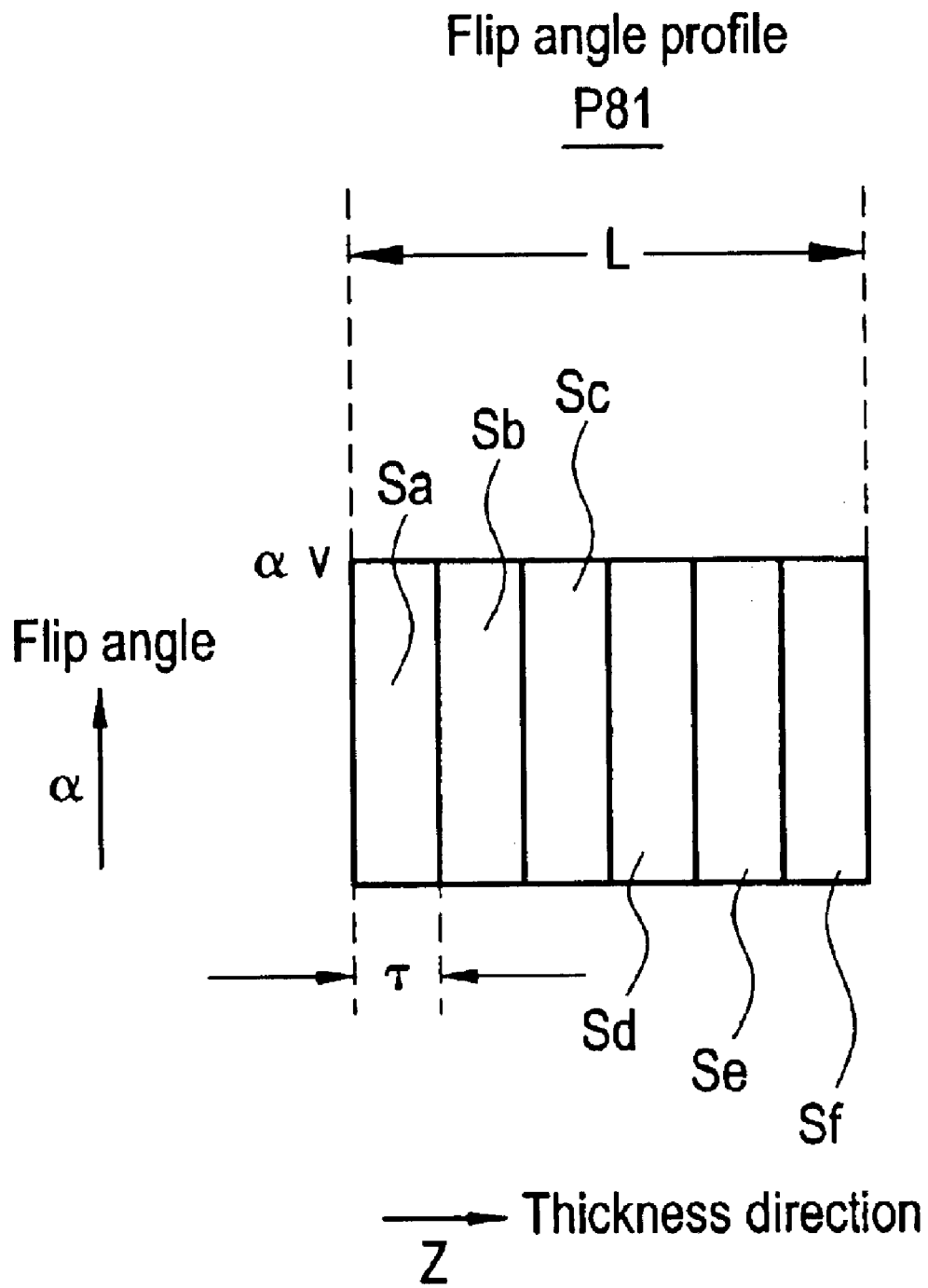
FIG. 10 is a prior art explanatory diagram showing a flip angle profile in accordance with a conventional technique.

FIG. 7 is an explanatory diagram showing a flip angle profile P51 in accordance with a fifth embodiment.

In the flip angle profile P51, the flip angle α for slabs S51–S56 is constant in the same slab, but varies in a stepwise manner between flip angles αs and αe at ends of the imaged region (R in FIG. 3).

In this case, the operator specifies the flip angles αs and αe at ends of the imaged region. Then, the computer 7 and sequence memory circuit 8 generate RF pulses achieving such a property.

According to the MRI apparatus of the fifth embodiment, the need to change the flip angle α in each of the slabs S51–S56 is eliminated, and calculation and control in RF pulse transmission are simplified.

Although description has been made on a case in which the MRA imaging is conducted according to the TOF technique in the first–fifth embodiments above, the present invention may be applied to a case in which the MRA imaging is conducted according to a PC (phase contrast) technique.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:

static magnetic field generating means for generating a static magnetic field; applied to a subject;

gradient magnetic field generating means for generating a gradient magnetic field applied to the subject;

RF pulse transmitting means for transmitting RF pulses with a flip angle profile including a first set of flip angles that vary with respect to a thickness direction measured along a thickness of each of a plurality of adjacent slabs formed by dividing an imaged region of the subject, said flip angle profile including a first average of a second set of flip angles of one of the slabs, and the first average is different than second average of a third set of flip angles of any one of remaining slabs, wherein said second set and said third set of flip angles are included within said first set of flip angles;

NMR signal receiving means for receiving NMR signals from the subject to which the RF pulses are applied; and blood flow imaging means for conducting blood flow imaging based on said NMR signals.

2. The MRI apparatus of claim 1, wherein a number of the slabs range from 3 to 100.

3. The MRI apparatus of claim 1, wherein said RF pulse transmitting means transmits ramped RF pulses in which said flip angles within the first set linearly vary.

4. The MRI apparatus of claim 1, wherein said MRI apparatus comprises flip angle specifying means for specifying flip angles at first end and a second end of said imaged, region and the flip angles within the first set linearly vary from a first flip angle at the first end to a second flip angle at the end.

5. The MRI apparatus of claim 1, wherein said MRI apparatus comprises flip angle specifying means for specifying one of a fourth set and a fifth set of flip angles, the fourth set includes a first flip angle at a first end of the imaged region and a second flip angle at a second end of the imaged region, one of the slabs includes a third end and a fourth end, the fifth set includes a third flip angle at the third end and a fourth flip angle at the second end, the flip angles within the first set curvilinearly vary from the first flip angle to the second flip angle, and the flip angles within the second set curvilinearly vary from the third end angle to the fourth end.

6. The MRI apparatus of claim 1, wherein said MRI apparatus comprises flip angle and ratio factor specifying means for specifying a first flip angle at one end of said imaged region and a ratio factor, and the flip angles within the first set linearly vary from said first flip angle to a second flip angle at another end of the imaged region, the second flip angle obtained by multiplying said first flip angle by said ratio factor.

7. The MRI apparatus of claim 1, wherein one the slabs includes a first end and a second end, said MRI apparatus comprises flip angle and ratio factor specifying means for specifying a first flip angle at the first end and a ratio factor, and the flip angles within the first set linearly vary from said first flip angle to a second flip angle at the second end, the second flip angle obtained by multiplying said first flip angle by said ratio factor.

8. The MRI apparatus of claim 1, wherein said RF pulse transmitting means transmits RF pulses having flip angles that match each other at an abutting portion between any two of the slabs that are adjacent to each other.

9. An MRI apparatus comprising:

static magnetic field generating means for generating a static magnetic field that is applied to a subject;

gradient magnetic field generating means for generating a gradient magnetic field that is applied to the subject;

RF pulse transmitting means for transmitting RF pulses with a flip angle profile including a first set of flip angles, wherein said first set of flip angles includes a second set of flip angles within a first slab of a plurality of adjacent slabs formed by dividing an imaged region of the subject, the first set including a third set of flip angles within any one of remaining of the slabs, the flip angles within the second set differ from flip angles within the third set, linearly vary from a first end of the first slab to a second end of the first slab;

NMR signal receiving means for receiving NMR signals from the subject; and blood flow imaging means for conducting blood flow imaging based on said NMR signals.

10. The MRI apparatus of claim 1, wherein said RF pulse transmitting means transmits RF pulses having a first set of values ranging from 5°–30° and a second set of values ranging from 35°–90°, wherein the first and second sets of values include values of flip angles within the first set.

11. An MRA imaging method comprising the steps of:

generating a static magnetic field that is applied to a subject;

generating a gradient magnetic field that is applied to the subject;

dividing an imaged region of the subject into a plurality of adjacent slabs;

transmitting RF pulses with a flip angle profile including a first set of flip angles that vary with respect to a thickness direction measured along a thickness of each of the slabs, said flip angle profile including first average of a second set of flip angles of one of the slabs, and the first average is different than a second average of a third set of flip angles of any one of remaining slabs, wherein said second set and said third set of flip angles are included within said first set of flip angles, conducting blood flow imaging based on said NMR signals generated from the subject.

12. The MRA imaging of claim 11, wherein the thickness of each of said slabs is in the range of 1.5 mm–5 cm.

13. The MRA imaging method of claim 11, wherein said RF pulses are ramped RF pulses in which said flip angles within the first set linearly vary.

14. The MRA imaging method of claim 11, wherein, when a head of the subject is defined as the imaged region and imaging is conducted by dividing the imaged region into a plurality of slabs adjacent to each other from a carotid artery to a top of the head, an average of flip angles in slabs near the carotid artery is smaller than an average of flip angles in slabs near the top of the head.

15. The MRA imaging method of claim 11, wherein blood flow imaging utilizing a TOF effect is conducted.

16. The MRI apparatus of claim 9, wherein said RF pulse transmitting means transmits RF pulses having a first set of values ranging from 5°–30° and a second set of values ranging from 35°–90°, wherein the first and second sets of values include values include values of flip angles within the first set.

17. The MRI apparatus of claim 1, wherein one of the flip angles within the second set is different from remaining flip angles within the second set.

* * * * *

UNITED STATES PATENT AND TRADEMARK OFFICE
CERTIFICATE OF CORRECTION

PATENT NO.        : 6,814,280 B2
APPLICATION NO.   : 10/372063
DATED             : November 9, 2004
INVENTOR(S)       : Miyoshi et al.

It is certified that error appears in the above-identified patent and that said Letters Patent is hereby corrected as shown below:

In Claim 1, column 9, line 35, after "first average is different than" insert -- a --.

In Claim 4, column 9, line 52, after "flying flip angles at" insert -- a --.

In Claim 4, column 9, line 55, after "at the" insert -- second --.

In Claim 7, column 10, line 9, after "wherein one" insert -- of --.

In Claim 9, column 10, line 35, after "within the third set," insert -- the flip angles within the second set --.

In Claim11, column 10, line 58, after "profile including" insert -- a --.

In Claim11, column 10, line 63, after "set of flip angles," insert -- and --.

In Claim12, column 10, line 66, after "MRA imaging" insert -- method --.

In Claim 14, column 11, line 6, after "imaged region into" delete "a" and insert therefor -- the --.

In Claim16, column 12, line 5, after "values include values" delete "include values".

Signed and Sealed this

Fifth Day of December, 2006

JON W. DUDAS
*Director of the United States Patent and Trademark Office*